United States Patent
Seffner et al.

(10) Patent No.: US 7,228,606 B1
(45) Date of Patent: Jun. 12, 2007

(54) METHOD FOR PRODUCING A PIEZOELECTRIC TRANSDUCER

(75) Inventors: Lutz Seffner, Dresden (DE); Andreas Schönecker, Freital (DE); Sylvia Gebhardt, Dresden (DE)

(73) Assignee: Fraunhofer-Gesellschaft zur Forderung der Forschung e.V., Munich (DE)

( * ) Notice: Subject to any disclaimer, the term of this patent is extended or adjusted under 35 U.S.C. 154(b) by 102 days.

(21) Appl. No.: 10/129,748

(22) PCT Filed: Oct. 12, 2000

(86) PCT No.: PCT/DE00/03609

§ 371 (c)(1),
(2), (4) Date: Jun. 11, 2002

(87) PCT Pub. No.: WO01/35468

PCT Pub. Date: May 17, 2001

(30) Foreign Application Priority Data

Nov. 10, 1999 (DE) ................................. 199 54 020

(51) Int. Cl.
*H04R 17/00* (2006.01)
(52) U.S. Cl. ................. 29/25.35; 331/155; 219/121.67; 219/121.69
(58) Field of Classification Search ............... 29/25.35; 331/155; 367/165, 155; 347/68, 72; 219/121.67, 219/121.69; 216/121.69
See application file for complete search history.

(56) References Cited

U.S. PATENT DOCUMENTS

| | | | |
|---|---|---|---|
| 4,412,148 A | * | 10/1983 | Klicker et al. ............. 310/358 |
| 4,726,099 A | * | 2/1988 | Card et al. ................. 29/25.35 |
| 4,820,897 A | * | 4/1989 | Lefevre ................. 219/121.67 |
| 4,869,768 A | * | 9/1989 | Zola ............................ 156/245 |
| 4,933,230 A | * | 6/1990 | Card et al. .................. 442/178 |
| 5,072,035 A | * | 12/1991 | Chen et al. ............ 252/62.9 R |
| 5,111,805 A | * | 5/1992 | Jaggy et al. .................... 601/4 |

(Continued)

FOREIGN PATENT DOCUMENTS

DE 196 24 204 C1 10/1997

OTHER PUBLICATIONS

John P. Rodgers and Nesbitt W. Hagood: "Preliminary Mach-Scale Hover Testing Of An Integral Twist-Actuated Rotor Blade"; Part of the SPIE Conference On Smart Structures and Integrated Systems, San Diego, California, Mar. 1998; SPIE vol. 3329, pp. 291-308.

(Continued)

*Primary Examiner*—A. Dexter Tugbang
*Assistant Examiner*—Terri Lynn Smith
(74) *Attorney, Agent, or Firm*—Breiner & Breiner, LLC

(57) ABSTRACT

A method of manufacturing a piezoelectric transducer including piezoelectric fibers in a polymer matrix is described. The piezoelectric fibers or fiber segments are jacketed with a liquid polymer substance in such a way that a distribution of longitudinal axes of the fibers or fiber segments about a preferential direction occurs. The fibers are compacted among each other and the polymer substance is cured. The resulting composite structure is subsequently so processed that areas of the fibers or fiber segments are exposed along the preferential direction. Then electrical contacts are applied on at least one part of the exposed areas. The method permits the very simple and low-cost manufacture of electro-mechanical transducers made of piezoelectric fibers.

8 Claims, 2 Drawing Sheets

U.S. PATENT DOCUMENTS

Figures 1, 2:
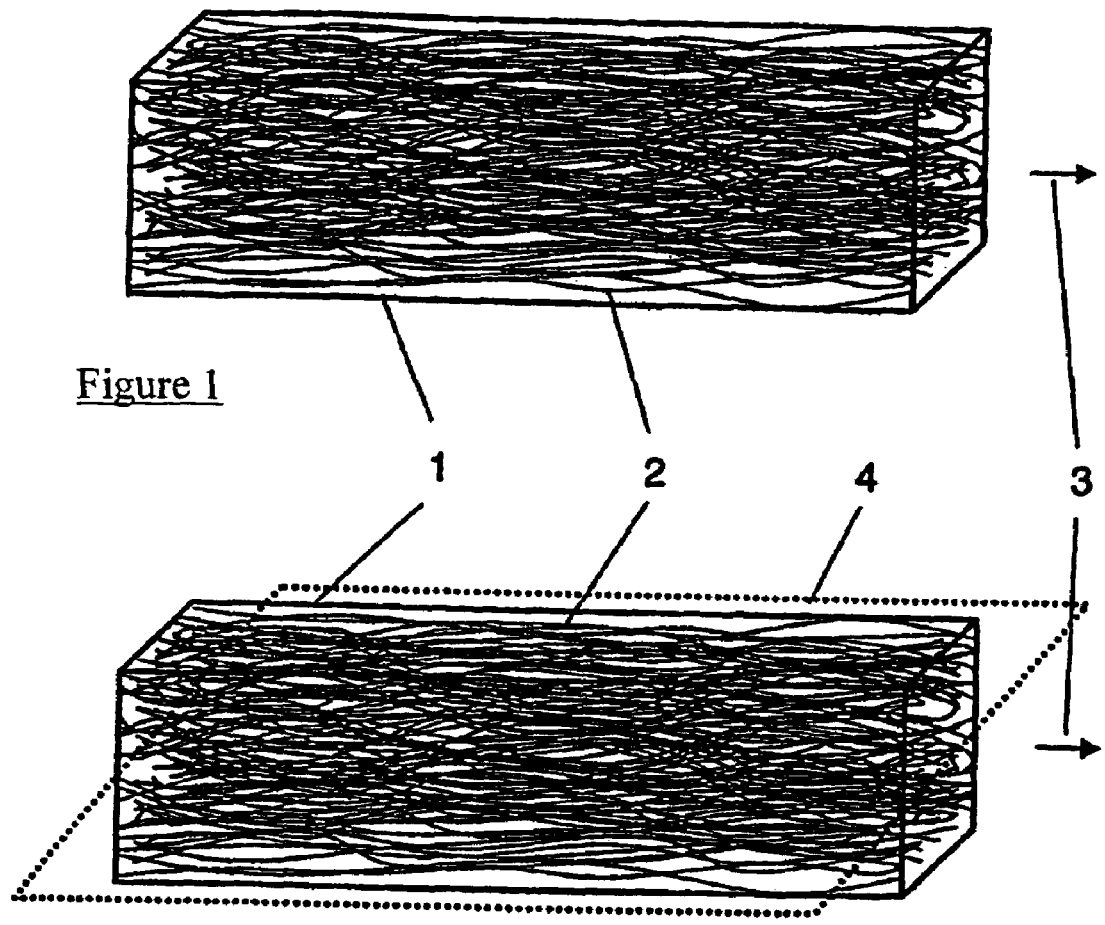

| | | | | |
|---|---|---|---|---|
| 5,615,466 | A * | 4/1997 | Safari et al. | 29/25.35 |
| 5,660,877 | A | 8/1997 | Venkataramani et al. | |
| 5,771,567 | A * | 6/1998 | Pierce et al. | 29/600 |
| 5,844,349 | A * | 12/1998 | Oakley et al. | 310/358 |
| 5,869,189 | A | 2/1999 | Hagood, IV et al. | |
| 6,081,979 | A * | 7/2000 | Kahn et al. | 29/25.35 |
| 6,088,894 | A * | 7/2000 | Oakley et al. | 29/25.35 |
| 6,301,761 | B1 * | 10/2001 | Brenner et al. | 29/25.35 |
| 6,620,287 | B2 * | 9/2003 | Cass | 156/296 |
| 6,629,341 | B2 * | 10/2003 | Wilkie et al. | 29/25.35 |

OTHER PUBLICATIONS

Ahmad Safari, Victor Janas and Bahram Jadidian: "Incorporation of Piezoelectric Pb $(Zr,Ti)O_3$ Fibers Into Ceramic/Polymer Composites"; SPIE vol. 2721, 1996, pp. 240-250.

* cited by examiner

METHOD FOR PRODUCING A PIEZOELECTRIC TRANSDUCER

FIELD OF INVENTION

The present invention relates to a method of manufacturing a piezoelectric transducer consisting of piezoelectric fibres in a polymer matrix on which electrodes are applied for controlling the fibres.

BACKGROUND OF INVENTION

Piezoelectric materials are important for many technological fields of application. Here materials are involved which generate electric charges in response to the effects of a mechanical load or change their shape in response to the effects of an electric field. The first aspect is known by the term "direct piezoelectric effect" whilst the latter case is referred to as "indirect piezoelectric effect".

The piezo ceramics are a special group of piezoelectric materials. For the production of piezo ceramics, the piezoelectric effect must be caused to occur selectively by polarising the ceramic material after vitrification in a strong electric field. In this operation, defined areas of the ceramic material, the domains, are oriented along the lines of the electric field in order to polarise the ceramic material in this direction. After the electric field has been switched off, one part of this polarisation is retained as remanent polarisation in the ceramic material. Hence, this polarising operation turns an isotropic material into an anisotropic material having piezoelectric characteristics. When an electric field is applied to the ceramic material, for example in the polarising direction, this material extends in the direction of the field ($d_{33}$ effect) whilst it contracts in a direction orthogonal on the field direction ($d_{33}$ effect). The type of deformation is hence dependent on the direction of the applied field relative to the polarising direction of the ceramic material. The 3-1 effect corresponds approximately to only ⅓ of the 3-3 effect, which is the deformation in the field direction. When piezoelectric ceramic materials are employed as actuators in technology, it is therefore envisaged, as a rule, to utilise the 3-3 effect.

Piezoelectric ceramic materials can also be used, of course, as sensors when the direct piezoelectric effect is utilised. In such a case, a deformation of the ceramic material generates an electric charge whose magnitude depends, inter alia, also on how the deformation takes place relative to the direction of the remanent polarisation of the ceramic material.

Lead zirconate titanate (PZT) is the piezoelectric material that is most frequently used in industry at present. This ceramic material has been used in technology for a long time in many different ways as resonator, actuator or sensor material.

Finely scaled components such as films, tiny rods or fibres are expedient for many fields of application. They entail, however, the problem of low mechanical strength of the piezoelectric ceramic materials to be made available in this form. This applies to both their handling in the manufacture of complex structures made of these ceramic materials and the limited possibility of power transmission by means of the piezoelectric effect into a component.

To overcome these problems, therefore composite materials are frequently used which consist of an organic polymer matrix with a PZT ceramic material embedded therein. On the one hand, the polymer matrix serves the purpose of endowing the thin-walled ceramic elements with a sufficient mechanical stability and, on the other hand, it has the function of transferring the deformations created by the piezo ceramic material into the structure, for instance, when vibrations are attenuated.

For example, an actuator with a composite design has become known from the U.S. Pat. No. 5,687,462, wherein vitrified piezo ceramic films are integrated into an organic matrix. The robust components so created may be used both for sensor and actuator functions in oscillating systems. There, the matrix endows the brittle PZT ceramic material with mechanical strength whilst it serves also to transfer power into a major structure. In these elements, the electric field is usually applied to the PZT film in the direction of the thickness so as to utilise the 3-1 effect. It is also possible to apply inter-digital electrodes on the PZT film for utilisation of the 3-3 effect for actuator applications. In these cases, however, high field gradients occur at the electrode corners in ceramic films, which may result in great strain in the ceramic material and in fracture of the monolithic piezo ceramic material.

More recently, therefore composite elements have also been used in addition to the PZT films, wherein active piezoelectric fibres are embedded in a polymer matrix. These systems can be operated both with utilisation of the 3-1 effect and—by means of inter-digital electrodes—with utilisation of the 3-3 effect.

Compared against composite structures, these composite fibre structures with a monolithic PZT film present several advantages. For example, firstly, an extension in the longitudinal direction of the fibres is mainly induced due to the anisotropy of the fibres, and secondly the fibres can be integrated throughout the structure with a wide extension. An adaptation to a three-dimensionally shaped structure is easier to realise with the fibres than with a monolithic PZT film.

A major problem in the manufacture of composite structures consisting of piezoelectric fibres resides, however, in the high tendency of these fibres to rupture, which requires specific devices for handling them. For example, the U.S. Pat. No. 5,869,189 describes a method of manufacturing composite fibre structures, where this problematic aspect becomes clear. In the method proposed there, several elongate piezoelectric fibres are placed into a mould in parallel and at a defined spacing from each other. To ensure the correct spacing and the parallel orientation of the fibres a comb-like structure may be provided on the bottom of this mould. Subsequently, a liquid polymer material is charged into the mould and allowed to cure together with the fibres. The polymer matrix so created presents substantially the thickness of the single layer of the fibres. Then, the surface of this polymer matrix is slightly grounded. This serves firstly the purpose of roughening the surface and secondly to expose some regions of the fibres. Finally, metallic silver is deposited as electrode layer on the surface of the matrix. Due to the previous roughening, the adherence of this electrode layer is improved and because of the exposure of isolated regions of the fibres, a direct electrical contact with the fibres can be established.

A substantial problem in the manufacture of this composite fibre structure consists, however, in the insertion of the long piezoelectric fibres in a parallel arrangement in the mould envisaged to this end. This involves the high risk of fracture of many fibres. Moreover, the required parallel orientation is linked up with a substantial expenditure in manufacture. The provision of very straight fibres, which is required to this end, is problematic, too, because fibres are often prone to bend in manufacture and can therefore no longer be oriented in parallel. This applies particularly to the case of very thin fibres having a diameter of <50 µm.

Another method of manufacturing composite fibre structures is known from the German Patent DE 198 29 216 A. There, the fibres are directly contacted by the electrodes via their periphery whilst they are enclosed at least partly. This is achieved by fixing the fibres in a conductive adhesive material and by potting them subsequently. This involves the problem, however, that the adjacent fibres must not be too close to each other or else the adhesive substance is drawn into the space between the fibres, due to the capillary effects, before it is cured. As a result, the electric disruptive strength is strongly reduced while the probability of disruptive breakdown by the time of polarisation of the fibres or in application as actuators is very high. Moreover, in this method, too, the difficulties in handling the extremely fragile piezoelectric ceramic fibres continue to exist.

SUMMARY OF THE INVENTION

The present invention is now based on the problem of providing a method of manufacturing a piezoelectric transducer, which does not entail the aforedescribed disadvantages, which is easy to carry out and which permits the application of fibres or fibre bundles of any grade whatsoever. Moreover, the method should also permit the manufacture of large-area non-plane components with directly integrated piezoelectric fibres and ensure transducers with a high electric strength.

This problem is solved with the method according to claim 1. Expedient embodiments of the method are the subject matters of the dependent claims.

In the inventive method, the piezoelectric fibres are jacketed, after their production either as individual fibres, as bulk of short fibre segments, as fibre bundle, i.e. in any grouping whatsoever of at least two fibres, or in a suitable combination, with a polymer substance. This may be achieved by introducing the fibres or fibre segments into a liquid polymer substance or by application of a liquid polymer onto the fibres or fibre segments, respectively. The piezoelectric fibres or fibre segments are so arranged that a distribution of the longitudinal axes of the fibres or fibre segments or—in the case of fibres not extending along a straight line—a distribution of the longitudinal axes of sections of the fibres or fibre segments about a preferential direction will be achieved. This is possible without a complex operation of precise orientation of the individual components.

The jacketing of the fibres or fibre segments is preferably carried out in a mould envisaged to this end, which predetermines the outside geometry of the composite structure. The fibres or fibre segments are mutually compressed in the polymer, which means that they are more closely approached to each other, and then the polymer is cured. Subsequently, the composite structure so created is processed in a way that regions of the fibres or fibre segments will be exposed along the preferential direction, i.e., in a plane parallel to the preferential direction.

Finally, the electrical contact is applied directly on at least one part of the exposed areas. The individual exposed areas should be so large that at least two electrodes of opposite polarity can be accommodated on one site.

In this method, a fibre arrangement may be used in which the longitudinal axes of the fibres are disposed with a statistical distribution about a preferential direction. With the majority of fibres, preferably a maximum variation of their longitudinal axis by 30° from this preferential direction occurs. In one embodiment, where substantially straight fibres are used, a fraction of at least 50% of the fibres in the polymer matrix varies, along their longitudinal extension, by at least one fibre diameter from the preferential direction. It is also possible to use bent fibres that vary from a straight-lined shape by at least one fibre diameter so that they cannot be oriented in parallel.

When in the inventive composite structure the polymer jacketing the fibre is removed in defined areas in a plane parallel to the preferential direction, it is always possible, due to the distribution of the longitudinal axes, to contact a defined percentage of the total of fibres present. The fraction able to be contacted in this manner encompasses both the share of fibres, expressed in figures, in total and also the length of the contacted segments of a fibre in the longitudinal direction. This means that hence a fibre need not be contacted over its entire length but that it is also possible to contact means of an inter-digital electrode that is applied as electrical contact on the surface of the composite structure after its processing.

In the inventive method, an expensive and complex parallel orientation of the individual fibres at a defined spacing from each other is not required. The method does not require either any long and straight individual fibres. Due to the distribution of the fibres or fibre segments, which are all not placed in a precise mutual array, rather a simple statistical contact establishment is achieved. When, for instance, the surface of the composite structure is ground, different fibres arise on the surface at different sites and may be contacted there.

The manufacture of such a piezoelectric transducer hence involves a complexity and expenditure substantially reduced in distinction from the known prior art transducers. The geometric quality of the fibres does not play a role here.

The electrical contact may be established, for instance, with the application of an electrically conductive layer on both sides or by application of an inter-digital structure on one or both surfaces.

Moreover, with the inventive method it is possible to manufacture also a piezo electric transducer even in a non-plane shape, e.g. in a shape adapted to a curved surface. To this end, it is only necessary to shape the outer form of the polymer matrix into the desired form prior to curing.

The composite structure may be processed for exposure of areas of the fibres with application of different techniques. Examples of such processing operations are grinding, laser treatment, sawing, sandblasting, wet chemical etching or ion beam techniques.

One particularly expedient embodiment of the method consists in the fact that a composite structure is manufactured with the piezoelectric fibres or fibre segments in accordance with the inventive method, which structure presents a thickness corresponding to a multiple of the thickness of the subsequent transducer. In this case, the preferential direction of the fibres or fibre segments extends orthogonally on the extension of the thickness of the composite structure. In this preferred embodiment, the composite structure is processed by separation in planes along the preferential fibre direction. This separation may be achieved, for example, by sawing the composite structure. In this operation, the structure is separated into individual plates or disks having the thickness of the piezoelectric transducer to be manufactured.

DETAILED DESCRIPTION OF THE DRAWINGS

Figure 3:
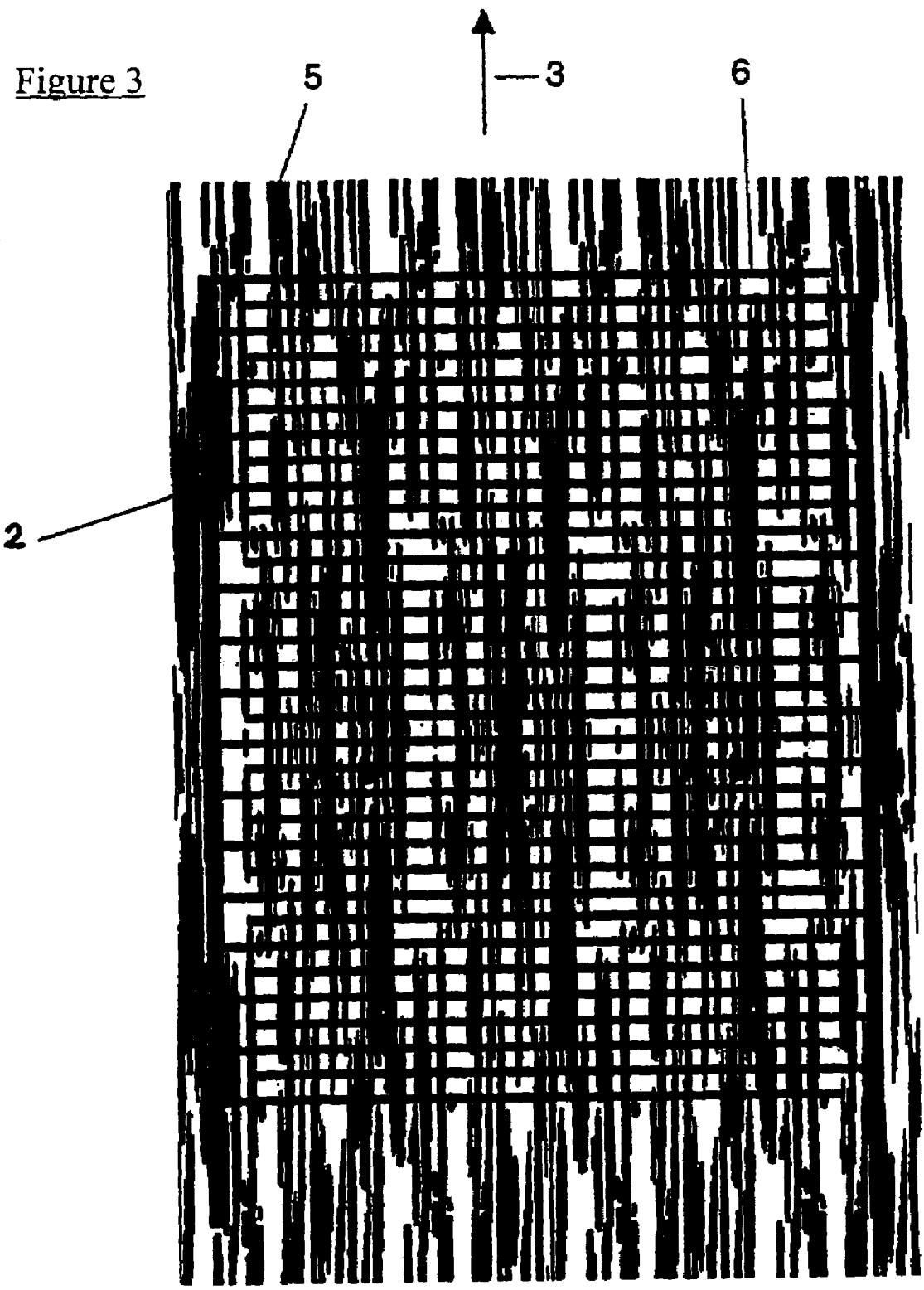

In the following, the inventive method will be explained again by two embodiments, with reference to the drawing wherein:

FIG. 1: shows an example of a block made of fibres infiltrated with a resin or a polymer and presenting a distribution of the longitudinal axes of the fibres about a preferential direction;

FIG. 2: illustrates the block of FIG. 1 with a roughly outlined cutting area for exposure of fibre regions; and FIG. 3: is a view of the resulting surface after cutting and after application of inter-digital electrodes.

PREFERRED EMBODIMENTS OF THE INVENTION

In the first example, a mould is provided that has dimensions of 6 cm×3 cm. This mould is filled with a polymer that is to be used as matrix. An epoxy resin, for instance, may be used as polymer. Then 2.5 g of a bundle of piezoelectric fibres having a length of roughly 5 cm is placed into the liquid polymer contained in the mould, and is so compressed that a layer having a thickness of 0.5 mm approximately will be created. The individual fibres present a mean fibre diameter of 20 to 30 μm. Subsequently, the polymer is cured together with the fibres. After curing, the mould is removed so as to obtain a flat plate of 6×3×0.05 cm³. This plate is then ground on the two opposite sides. On one of these sides, a conductive adhesive is applied for an inter-digital electrode consisting of 50 pairs of fingers spaced from each other by a distance of 1 mm, whereupon the combination is sealed with a thin layer of epoxy resin.

The second side may be provided in the same manner with an inter-digital electrode that is applied in congruence with the opposite electrode.

The piezoelectric transducer so produced in the form of a composite structure may be used not only as bending actuator but also as dilatation transducer and for sensory applications. It can also be incorporated into a structure and be used, for instance, for the purpose of attenuation of vibrations.

In a second example, 61 g of piezoelectric fibres are placed into a mould containing a liquid epoxy resin, and then they are compressed to form a block measuring 2×2×5 cm³. After curing, this block is sawed along the longitudinal orientation of the fibres to form individual plats measuring 2×5 cm and having a thickness of 0.2 mm. Subsequently, an inter-digital electrode with 50 pairs of fibres that are spaced from each other by 1 mm is applied on both sides in a laterally reversed position on each of the plates, whereupon the combination is sealed with a thin layer of epoxy resin.

In this manner, a dilatation transducer is produced that may be integrated as reinforcing element into a structure.

This is a particularly expedient embodiment of the method because the production of the transducer and the exposure of the surface can be carried out in a single technological operation in a very simple and low-cost manner.

As an example, FIG. 1 illustrates a block 1 made by compression and curing from fibres 2 with infiltrated resin or polymer, whose longitudinal axes are distributed about a preferential direction 3. In this example, the non-linear shape of the fibres is clearly visible, which even promotes the subsequent contacting operation.

In FIG. 2, a cutting surface 4 is roughly outlined along which the block 1 is sawed for exposing areas of the fibres 2 along the preferential direction 3.

The surface that results from the cut along the cutting surface 4 is illustrated in FIG. 3. The areas 5 of the fibres 2, which are exposed by cutting along the preferential direction, are clearly visible. An inter-digital electrode 6, whose fingers extend orthogonally on the preferential direction 3 (cf. FIG. 2) are applied on the surface with the exposed fibre regions 5 for contacting the fibres 2. In this manner, a piezoelectric transducer is realized in a simple and low-cost manner.

The invention claimed is:

1. Method of manufacturing a piezoelectric transducer, comprising:
    encasing piezoelectric fibers or fiber segments having a longitudinal axis with a respective orientation each with a liquid polymer substance wherein said orientations of longitudinal axes of said fibers or fiber segments have a distribution about a preferential direction so that said fibers or fiber segments are not in a mutual array;
    curing the polymer substance with the fibers or fiber segments so as to form a composite structure;
    processing the composite structure so as to expose areas of said fibers or fiber segments along said preferential direction; and
    applying electrical contacts for controlling the transducer on at least one part of said exposed areas; wherein
    said fibers or fiber segments being compressed among each other prior to curing,
    wherein said processing is carried out by separation in planes along said preferential direction, and
    wherein substantially straight fiber or fiber segments are encased with said liquid polymer substance in such a way that at least 50% of said fibers or fiber segments in said polymer substance vary, along their length, by at least one fiber diameter from said preferential direction.

2. The method according to claim 1, wherein said encasing is carried out by placing said fibers or fiber segments as a bundle or in loose bulk into a mold and by pouring said liquid polymer substance over them.

3. Method of manufacturing a piezoelectric transducer, comprising:
    encasing piezoelectric fibers or fiber segments having a longitudinal axis with a respective orientation each with a liquid polymer substance wherein said orientations of longitudinal axes of said fibers or fiber segments have a distribution about a preferential direction so that said fibers or fiber segments are not in a mutual array;
    curing the polymer substance with the fibers or fiber segments so as to form a composite structure;
    processing the composite structure so as to expose areas of said fibers or fiber segments along said preferential direction; and
    applying electrical contacts for controlling the transducer on at least one part of said exposed areas; wherein
    said fibers or fiber segments being compressed among each other prior to curing,
    wherein said processing is carried out by separation in planes along said preferential direction, and
    wherein said fibers or fiber segments are arranged so that at least half have a bending or curvature that varies from a straight-lined form by at least one fiber diameter.

4. Method according to claim 3, wherein said encasing is carried out by placing said fibers or fiber segments as a bundle or in loose bulk into a mold and by pouring said liquid polymer substance over them.

5. Method according to claim 1 or 3, wherein said separation is carried out by sawing the composite structure in parallel with said preferential direction.

6. Method according to claim 1 or 3, wherein said separation is carried out by means of a laser beam.

7. Method according to claim 1 or 3, wherein said electrical contacts are one or several inter-digital electrode(s).

8. Method according to claim 1 or 3, wherein said composite structure is manufactured in a plate-shaped form.

* * * * *

UNITED STATES PATENT AND TRADEMARK OFFICE
CERTIFICATE OF CORRECTION

PATENT NO. : 7,228,606 B1  Page 1 of 1
APPLICATION NO. : 10/129748
DATED : June 12, 2007
INVENTOR(S) : Lutz Seffner et al.

It is certified that error appears in the above-identified patent and that said Letters Patent is hereby corrected as shown below:

On the Title Page

Item (73) Assignee, "Fraunhofer-Gesellschaft zur Forderung der Forschung e.V." should read -- Fraunhofer-Gesellschaft zur Forderung der angewandten Forschung e.V. --.

Column 1,
Line 35, "($d_{33}$ effect)." should read -- ($d_{31}$ effect). --.

Column 4,
Line 20, "contact means of an inter-digital electrode that is applied as" should read -- contact many fibres on short sections of their entire length. Contacting is preferably made by means of an inter-digital electrode that is applied as --.

Signed and Sealed this

Second Day of June, 2009

JOHN DOLL
*Acting Director of the United States Patent and Trademark Office*